US011670956B2

(12) United States Patent
Truphemus et al.

(10) Patent No.: US 11,670,956 B2
(45) Date of Patent: *Jun. 6, 2023

(54) METHOD FOR PRECHARGING AN INTEGRATED-CIRCUIT SUPPLY, AND CORRESPONDING INTEGRATED CIRCUIT

(71) Applicant: STMicroelectronics (Rousset) SAS, Rousset (FR)

(72) Inventors: Laurent Truphemus, Pourrieres (FR); Sebastien Ortet, Beaurecueil (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/459,465

(22) Filed: Aug. 27, 2021

(65) Prior Publication Data
US 2021/0391744 A1 Dec. 16, 2021

Related U.S. Application Data

(63) Continuation of application No. 16/267,968, filed on Feb. 5, 2019, now Pat. No. 11,139,676.

(30) Foreign Application Priority Data

Feb. 6, 2018 (FR) ...................................... 1850969

(51) Int. Cl.
*H02J 9/00* (2006.01)
*G06F 1/26* (2006.01)
(Continued)

(52) U.S. Cl.
CPC .............. *H02J 9/005* (2013.01); *G06F 1/263* (2013.01); *G06F 1/30* (2013.01); *G11C 5/141* (2013.01);
(Continued)

(58) Field of Classification Search
CPC ... H02J 9/005; H02J 7/34; H02J 9/061; G06F 1/263; G06F 1/30; G11C 5/141;
(Continued)

(56) References Cited

U.S. PATENT DOCUMENTS 5,748,560 A 5/1998 Sawada
6,751,109 B2 6/2004 Doss et al.
(Continued)

FOREIGN PATENT DOCUMENTS

CN 1156886 A 8/1997
CN 1444767 A 9/2003
(Continued)

OTHER PUBLICATIONS

Dictionary.com, "Definition of the RAM," pp. 1 (Year: NA) (Year: NA).*
Dictionary.com,"The definition of Ram," pp. 1 (Year: NA).

*Primary Examiner* — Pinping Sun
(74) *Attorney, Agent, or Firm* — Slater Matsil, LLP

(57) ABSTRACT

An integrated circuit includes: a primary supply stage including a primary supply node, the primary supply stage being configured to deliver a primary supply voltage to the primary supply node; a secondary supply stage including a secondary supply node, the secondary supply stage being configured to deliver a secondary supply voltage to the secondary supply node; a supply-switching circuit; a precharging circuit controllably coupled to the secondary supply node via the supply-switching circuit; and a volatile memory circuit controllably coupled to the primary supply node and the secondary supply node via the supply-switching circuit, wherein the switching circuit is configured to connect a supply of the volatile memory circuit either to the primary supply node in a primary supply mode, or to the secondary supply node in a secondary supply mode.

20 Claims, 4 Drawing Sheets

(51) Int. Cl.
  *G06F 1/30* (2006.01)
  *G11C 5/14* (2006.01)
  *G11C 11/4074* (2006.01)
  *G11C 16/30* (2006.01)
  *G11C 11/40* (2006.01)

(52) U.S. Cl.
  CPC .......... *G11C 11/4074* (2013.01); *G11C 16/30* (2013.01); *G11C 5/14* (2013.01); *G11C 11/40* (2013.01)

(58) Field of Classification Search
  CPC ....... G11C 11/4074; G11C 16/30; G11C 5/14; G11C 11/40
  See application file for complete search history.

(56) References Cited

U.S. PATENT DOCUMENTS

| | | | |
|---|---|---|---|
| 7,170,197 B2 * | 1/2007 | Lopata | H02M 3/158 307/70 |
| 7,298,637 B2 | 11/2007 | Ma et al. | |
| 8,144,536 B2 | 3/2012 | Kobayashi | |
| 9,218,856 B2 | 12/2015 | Lee et al. | |
| 9,570,118 B2 | 2/2017 | Lee et al. | |
| 9,715,924 B2 * | 7/2017 | Mokhlesi | G11C 16/0483 |
| 9,916,874 B2 | 3/2018 | Katoch et al. | |
| 9,997,213 B2 | 6/2018 | La Rosa et al. | |
| 11,139,676 B2 * | 10/2021 | Truphemus | G06F 1/30 |
| 2001/0028591 A1 * | 10/2001 | Yamauchi | G11C 11/417 365/227 |
| 2002/0145405 A1 * | 10/2002 | Murakami | H02J 7/0069 320/130 |
| 2003/0201673 A1 * | 10/2003 | Sim | G11C 11/4074 307/80 |
| 2004/0264275 A1 | 12/2004 | Gou | |
| 2007/0079153 A1 * | 4/2007 | Bain | G06F 1/263 713/300 |
| 2008/0222436 A1 | 9/2008 | Matsui | |
| 2009/0303819 A1 | 12/2009 | Park et al. | |
| 2010/0188238 A1 * | 7/2010 | Yasuda | H02J 5/00 320/162 |
| 2011/0157964 A1 | 6/2011 | McPartland et al. | |
| 2012/0030482 A1 * | 2/2012 | Russell | G06F 1/3203 713/300 |
| 2016/0027495 A1 | 1/2016 | Kim et al. | |
| 2017/0106758 A1 * | 4/2017 | Sakatani | B60R 16/03 |
| 2018/0331569 A1 * | 11/2018 | Pecorari | H02M 1/32 |
| 2021/0391744 A1 | 12/2021 | Truphemus et al. | |

FOREIGN PATENT DOCUMENTS

| | | |
|---|---|---|
| CN | 1577947 A | 2/2005 |
| CN | 101136244 A | 3/2008 |
| CN | 102576236 A | 7/2012 |
| CN | 104993574 A | 10/2015 |
| CN | 105788622 A | 7/2016 |
| CN | 206236430 U | 6/2017 |
| CN | 209298964 U | 8/2019 |
| JP | 2013120607 A * | 6/2013 |
| JP | 2013120607 A | 6/2013 |

\* cited by examiner

METHOD FOR PRECHARGING AN INTEGRATED-CIRCUIT SUPPLY, AND CORRESPONDING INTEGRATED CIRCUIT

CROSS-REFERENCE TO RELATED APPLICATIONS

This application is a continuation of U.S. patent application Ser. No. 16/267,968, filed Feb. 5, 2019, entitled "Method for Precharging an Integrated-Circuit Supply, and Corresponding Integrated Circuit," which claims the benefit of French Application No. 1850969, filed on Feb. 6, 2018. All of the aforementioned applications are incorporated by reference in their entireties.

TECHNICAL FIELD

Embodiments and implementations relate to integrated circuits, and in particular examples to a method for pre-charging an integrated-circuit supply and a corresponding integrated circuit.

BACKGROUND

Integrated circuits including a volatile memory, for example the integrated circuits of microcontrollers, are generally equipped with a primary supply source and a secondary supply source.

The primary supply source is used in a primary operating mode of the integrated circuit, and the secondary supply is used in a secondary operating mode, for example a standby operating mode or a backup operating mode, the latter being switched to in case of an unexpected interruption of the primary supply.

In a volatile memory, the primary operating mode for example corresponds to an operating mode in which operations of writing and reading data are carried out, whereas the secondary operating mode aims to prevent the loss of data from at least one portion of the volatile memory.

Whether the secondary operating mode is a standby or backup mode, the secondary operating mode typically aims to save power.

Thus, it is desirable to minimize power consumption in the so-called secondary operating modes.

In addition, the supply voltage drops during transitions from the primary supply mode to the secondary supply mode, because of what is called a current drain of the integrated circuit, which is abruptly drawn from the secondary supply source at the moment of the transition. In the example of a volatile memory, the current drain may be due to the leakage currents of the components of the memory.

Conventional pre-charging devices, such as a resistor designed to pass a pre-charging resistor current or a circuit based on a plurality of transistors and designed to pass a given pre-charging current, are intended to prepare the secondary supply source by passing a current therethrough before the mode transition.

These devices typically are not all identical in terms of unexpected events that affect some or the whole of their manufacturing processes, and in terms of behavior with respect to temperature and of behavior with respect to the actual level of the supply voltage.

However, if the pre-charging current is lower than the current drain, a transient voltage drop is produced on the supply, this being a problem with regard to the retention of data.

In contrast, if the pre-charging current is higher than the current drain, a transient overvoltage is produced on the supply, this being a problem with regard to stresses placed on the components of the integrated circuit.

Thus, it is desirable to optimize devices for pre-charging the secondary supply of an integrated circuit, especially with a view to decreasing power consumption, in particular the power consumption of a secondary supply mode.

SUMMARY

According to one aspect an integrated circuit is proposed, this circuit including a primary supply stage intended to deliver a primary supply voltage to a primary supply node, a secondary supply stage intended to deliver a secondary supply voltage to a secondary supply node, a supply-switching circuit, a pre-charging circuit and a volatile memory circuit, the switching circuit being configured to connect a supply of the memory circuit either to the primary supply node in a primary supply mode, or to the secondary supply node in a secondary supply mode, the secondary supply stage being configured to supply the secondary supply node with the secondary supply voltage during the primary supply mode, wherein the pre-charging circuit includes a replica circuit that has the same configuration as at least one portion of the memory circuit and that is intended to pass a replica current, the pre-charging circuit being configured to generate, in the primary supply mode, from the replica current, a pre-charging current that is representative of a current passed by the memory circuit in the secondary supply mode, and to make the pre-charging current pass to the secondary supply node.

Such a pre-charging circuit, including a replica circuit, allows a pre-charging current that accurately reproduces the current passed by the memory circuit in the secondary supply mode to be generated. This in particular allows the transient voltage drops and transient overvoltages on the secondary supply stage to be limited, or even eliminated, and thus the value of the secondary supply voltage to be decreased.

According to one embodiment, the pre-charging circuit includes a current-amplifying circuit that is configured to amplify a replica current passed by the replica circuit into an amplified current, and the pre-charging circuit is configured to pass the pre-charging current including the sum of the replica current and the amplified current.

This in particular allows the bulk of the replica circuit to be limited while decreasing the precision of the pre-charging circuit only very slightly.

According to one embodiment in which the memory circuit includes a memory plane including memory cells, the replica circuit includes memory cells that are twins of memory cells of the memory plane. What is meant by "memory cells that are twins of" is that the memory cells of the replica circuit are identical to those of the memory plane in terms of manufacturing process, of type of components, of orientation, of environment and of configuration. The only difference that there may possibly be being due to the distance possibly separating the memory cells.

According to one embodiment in which the memory circuit includes access and control elements, the replica circuit includes access and control elements that are twins of the access and control elements of the memory circuit.

According to one embodiment, the current-amplifying circuit includes at least one current mirror including an input transistor connected between the secondary supply node and the replica circuit, and is configured to amplify the replica current with a gain reflecting a potential difference between the conduction terminals of the input transistor.

According to one embodiment in which the volatile memory circuit is configured to retain data in memory at a supply voltage higher than a minimum voltage for retention of data, the secondary supply stage is intended to deliver a secondary supply voltage having a value included between 1.0 and 1.15 times the value of the minimum voltage for retention of data.

Specifically, since the pre-charging circuit prevents voltage drops on the transition of the supply modes, the secondary supply voltage may be dropped to the minimum value for retention of data, without running the risk of losing data stored in memory.

For example, the integrated circuit incorporates a computing unit such as a processor or a controller.

An electronic apparatus, such as a mobile telephone or a personal computer, including an integrated circuit such as defined above, is also proposed.

According to another aspect, a method is proposed for supplying integrated circuits including a volatile memory circuit, including a primary supply mode in which a primary supply voltage is delivered to the memory circuit and a secondary supply mode in which a secondary supply voltage is delivered to the memory circuit, wherein, in the primary supply mode, the secondary supply voltage is delivered to a secondary supply node, the method including, during the primary supply mode, a pre-charging phase in which a replica current is made to pass through a replica circuit that is connected to the secondary supply node and that has the same configuration as at least one portion of the memory circuit, a pre-charging current that is representative of a current passed by the memory circuit in the secondary supply mode is generated from the replica current, and the pre-charging current is made to pass to the secondary supply node.

According to one implementation, the generation of the pre-charging current includes amplifying the replica current into an amplified current, and summing the replica current and the amplified current.

According to one implementation, the amplification of the replica current is dimensioned to compensate for a potential difference, introduced by the amplification, between the replica circuit and a secondary supply node to which the secondary supply voltage is delivered.

According to one implementation in which the volatile memory circuit is configured to retain data in memory at a supply voltage higher than a minimum voltage for retention of data, the secondary supply voltage has a value included between 1.0 and 1.15 times the value of the minimum voltage of retention of data.

In other words, the proposed embodiments and implementations allow voltage drops during a supply-mode transition to be greatly limited or even prevented and the consumption of the integrated circuit in the secondary supply mode to be optimized. Specifically, the secondary supply mode may thus have a very low power consumption (in comparison to the primary supply mode) via a minimization of the secondary supply voltage, while guaranteeing the retention of data in memory. Furthermore, the proposed embodiments and implementations allow the size of memory that can be supplied by a given secondary-supply voltage source to be increased.

BRIEF DESCRIPTION OF THE DRAWINGS

Other advantages and features of the invention will become apparent on examining the detailed description of completely non-limiting embodiments and implementations and the appended drawings, in which.

DETAILED DESCRIPTION OF ILLUSTRATIVE EMBODIMENTS

Embodiments and implementations relate to integrated circuits, for example the integrated circuits of microcontrollers, and in particular to integrated circuits having a secondary supply mode and a pre-charging device relating thereto.

Figure 1:
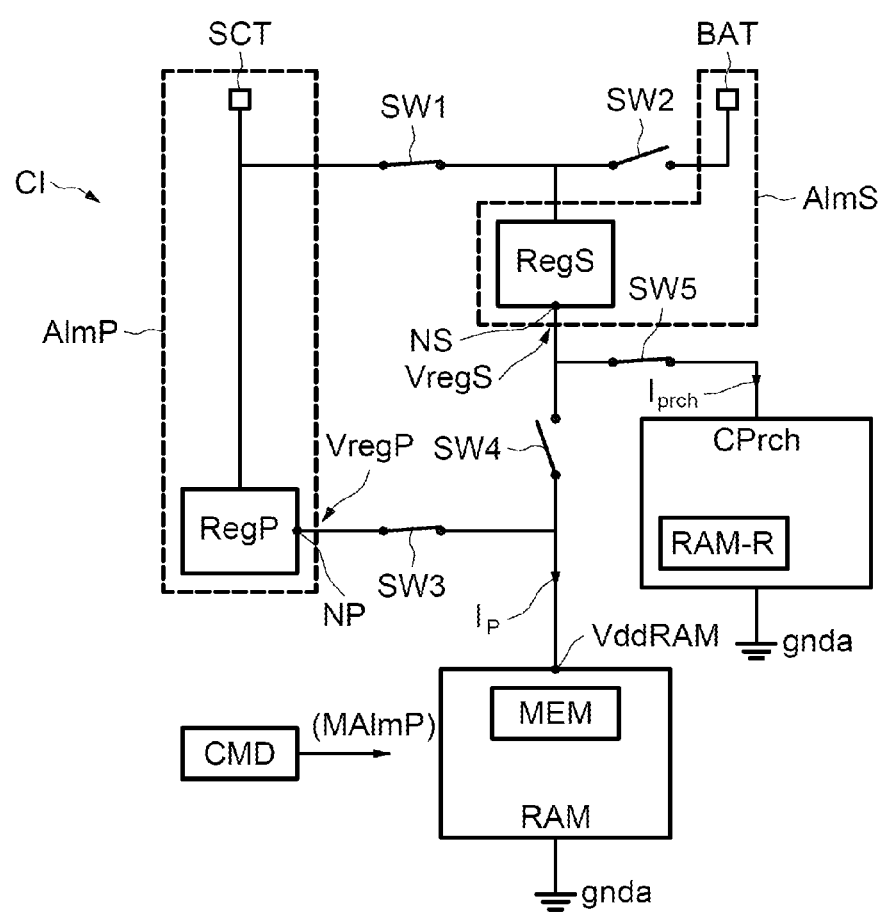
FIGS. 1 to 6 schematically illustrate various embodiments and implementations of the invention.
Figure 2:
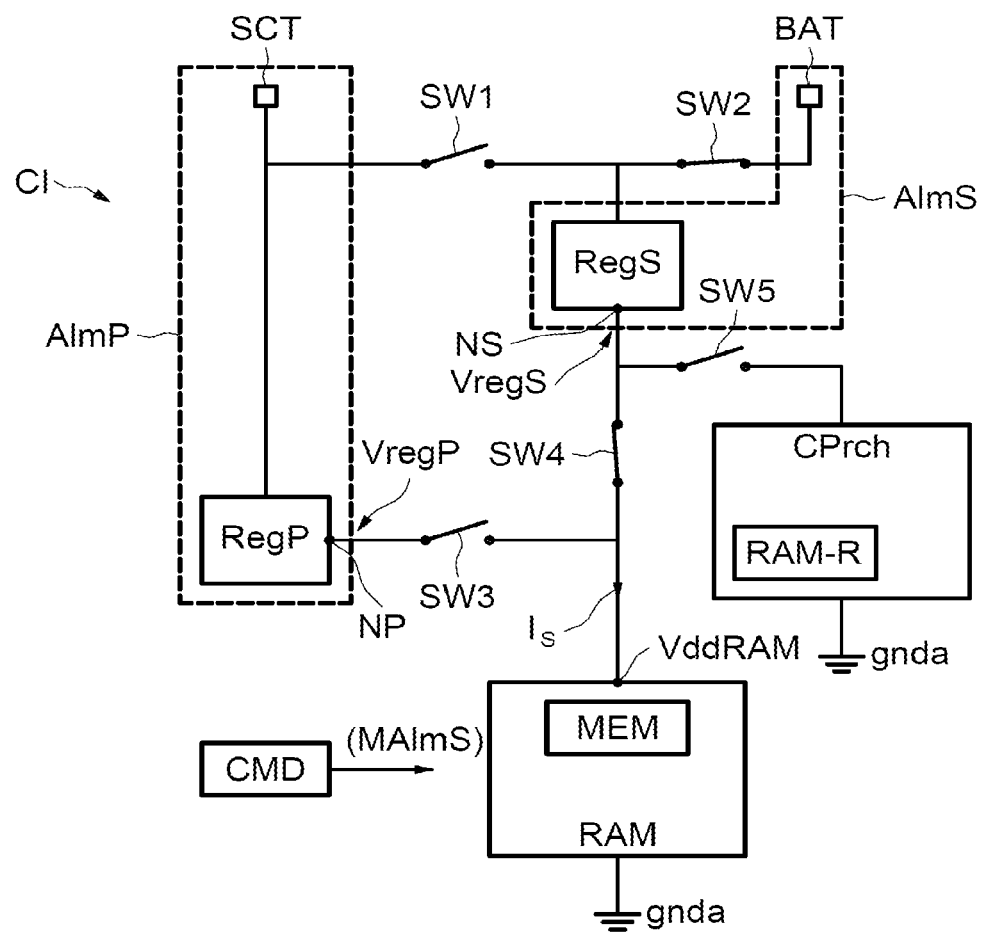

FIGS. 1 and 2 show an example of an integrated circuit CI including a volatile memory circuit RAM that is able to operate in a primary supply mode MAlmP or a secondary supply mode MAlmS.

FIG. 1 illustrates the integrated circuit CI in the primary supply mode MAlmP.

FIG. 2 illustrates integrated circuit CI in a secondary supply mode MAlmS.

For example, the primary supply mode corresponds to a powerful supply, i.e. for example one obtained by plugging into the mains or from a battery of high charge. The secondary supply mode for example corresponds to a source the power of which is to be preserved, for example in standby configuration in which it is sought to restrict power consumption, or in a backup-supply configuration in which power is supplied by a dedicated battery.

The integrated circuit CI illustrated by FIG. 2 is in a secondary supply mode of the backup-supply type.

In the case of a volatile memory RAM, the primary configuration allows operations of writing and reading data to be carried out, whereas the secondary configuration prevents the loss of data retained in at least one portion of the volatile memory RAM.

The integrated circuit CI includes a primary supply stage AlmP intended to deliver a primary supply voltage VregP to a primary supply node NP, and a secondary supply stage AlmS intended to deliver a secondary supply voltage VregS to a secondary supply node NS.

In this example, the primary supply stage AlmP includes a primary regulator RegP the input of which is connected to a primary voltage terminal SCT that delivers a primary voltage, for example obtained from a mains supply or from a charged battery. The primary regulator RegP includes an output forming the primary supply node NP, and is configured to regulate the voltage thereon to a primary supply voltage VregP, in a manner that is optimal for the primary configuration of the volatile memory RAM.

In this example, the secondary supply stage AlmS includes a secondary regulator RegS the input of which is able to be connected to the primary voltage terminal SCT or to a secondary voltage terminal BAT that delivers a secondary voltage. The secondary voltage is for example obtained from a battery or a source for which it is sought to minimize consumption. The secondary regulator RegS includes an output forming the secondary supply node NS, and is configured to regulate the voltage thereon to a secondary supply voltage VregS in a manner that is optimal for the secondary configuration of the volatile memory RAM.

A supply-switching circuit is configured to connect a supply VddRAM of the volatile memory circuit RAM either to the primary supply node NP in the primary supply mode MAlmP, or to the secondary supply node NS in the secondary supply mode MAlmS.

In certain embodiments, the supply terminal VddRAM may be a supply dedicated to the core (MEM) of the memory circuit RAM, among other supplies of the memory circuit that are for example dedicated to peripheral elements.

In this example, the supply-switching circuit includes five switches SWi, with i {1;2;3;4;5}, and a control circuit CMD that is configured to control the switches SWi. Control of the switches SWi allows the circuit to be placed either into the primary supply mode MAlmP, in order to deliver, to the volatile memory RAM, the primary supply voltage VregP, or into the secondary supply mode MAlmS, in order to deliver, to the volatile memory RAM, the secondary supply voltage VregS.

In this example, a first switch SWi allows the input of the secondary regulator RegS to be connected to or disconnected from the primary voltage terminal SCT; a second switch SW2 allows the input of the secondary regulator RegS to be connected to or disconnected from the secondary voltage terminal BAT; a third switch SW3 allows the output NP of the primary regulator RegP to be connected to or disconnected from the supply VddRAM of the volatile memory circuit RAM; a fourth switch SW4 allows the output NS of the secondary regulator RegS to be connected to or disconnected from the supply VddRAM of the volatile memory circuit RAM; a fifth switch SW5 allows the output NS of the secondary regulator RegS to be connected to or disconnected from a pre-charging circuit CPrch.

In this example, the control circuit CMD places the integrated circuit CI into the primary supply mode MAlmP by controlling shut the first switch SW1, the third switch SW3 and the fifth switch SW5, and by controlling open the second switch SW2 and the fourth switch SW4.

Thus, in the primary supply mode MAlmP, the primary regulator RegP delivers a primary supply voltage VregP to the volatile memory circuit RAM, allowing, for example, reading and writing operations to be carried out therein. The secondary regulator RegS generates a secondary supply voltage VregS on the secondary supply node NS during the primary supply mode MAlmP, from the primary voltage (SCT), and the pre-charging circuit CPrch is connected to the secondary supply node NS.

In other words, the secondary supply stage AlmS is configured to supply the secondary supply node NS with the secondary supply voltage VregS during the primary supply mode MAlmP.

The pre-charging circuit CPrch includes a replica circuit RAM-R that has the same configuration as at least one portion of the memory circuit RAM and that is intended to pass a replica current IRAMR. The pre-charging circuit CPrch is configured to generate, in the primary supply mode MAlmP, from the replica current IRAMR, a pre-charging current Iprch that is representative of a current IS passed by the memory circuit RAM in the secondary supply mode MAlmS, and to make the pre-charging current Iprch pass to the secondary supply node NS.

In contrast, the control circuit CMD places the integrated circuit into the secondary supply mode MAlmS by controlling open the first switch SW1, the third switch SW3 and the fifth switch SW5, and by controlling shut the second switch SW2 and the fourth switch SW4.

The secondary supply mode MAlmS, such as illustrated by FIG. 2, in this example corresponds to what is called a back-up supply.

However there is, in particular in microcontrollers or microprocessors, another secondary mode that is referred to as standby. In a standby secondary supply mode according to this example, the control circuit CMD controls open the second switch SW3, the third switch SW3 and the fifth switch SW5, and controls shut the first switch SW1 and the fourth switch SW4. The secondary regulator RegS is thus supplied by the primary voltage terminal SCT. The primary regulator RegP is turned off in the standby secondary mode.

In both cases, in the secondary supply mode MAlmS, the secondary regulator RegS delivers a secondary supply voltage VregS to the volatile memory circuit RAM, for example allowing the loss of data from memory to be prevented. The minimum voltage for retention of data, below which data are lost from memory, is for example equal to 0.7 V.

Here, the secondary regulator generates the secondary supply voltage VregS from the secondary voltage (BAT), and the pre-charging circuit CPrch is disconnected from the secondary supply node NS.

For example, the primary voltage (SCT) is 3.3 V, or is included in a range that is between 1.6 V and 3.6 V, and the primary supply voltage VregP is regulated to 1.2 V. For example, the secondary voltage (BAT) is 3.3 V, or is included in a range that is between 1.2 V and 3.6 V, and the secondary supply voltage VregS is regulated to 0.7 V at least, and preferably to a value that is higher but close to a minimum voltage for retention of data of the volatile memory RAM, for example a voltage included in a range that is between 1.0 and 1.15 times the minimum voltage for retention of data.

In the primary supply mode MAlmP, when the volatile memory circuit RAM receives, via its supply VddRAM, the primary supply voltage VregP generated by the primary regulator RegP and delivered to the primary supply node NP, the memory circuit RAM consumes a non-negligible current IP, which is thus "drawn" from the primary supply node NP.

Likewise, in the secondary supply mode MAlmS, receiving the secondary supply voltage VregS via its supply VddRAM, the memory circuit RAM consumes a non-negligible current IS, which is thus "drawn" from the secondary supply node NS.

Figure 3:
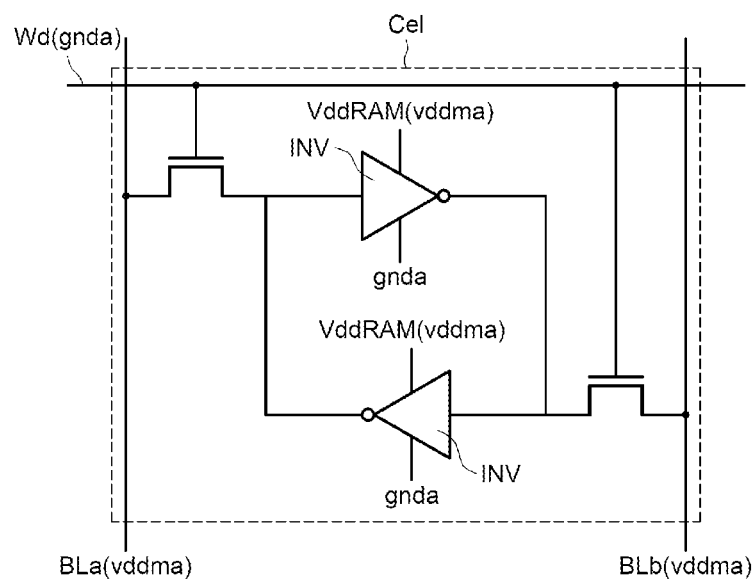

Specifically, the memory circuit RAM includes a memory plane MEM equipped with memory cells Cel, such as shown by FIG. 3. The memory circuit RAM furthermore includes control and access elements, allowing, conventionally, the memory cells Cel to be accessed in order to allow, in particular, writing and reading operations to be carried out.

FIG. 3 shows a conventional example of a memory cell Cel of a volatile memory circuit RAM.

The memory cell Cel includes an input Wd, two terminals BLa and BLb of input/output type, two inverters INV and two access transistors that are controlled by the signal Wd.

The two inverters INV are connected back to back, the output of one being connected to the input of the other, and they are on the one hand supplied by a supply voltage VddRAM and on the other hand connected to ground gnda. They allow a datum to be stored.

The input Wd controls the two access transistors the switching of which allows the datum stored in the two inverters INV to be accessed or not. The terminals BLa and BLb correspond to the datum and to the inverted datum, respectively. When the input Wd is raised to a high voltage value, the access transistors are turned on and the data on BLa and BLb may be read in read mode, or written in write mode. When the input Wd is lowered to a low voltage value, the access transistors are turned off and the data present beforehand on BLa and BLb remain stored in the loop of the two inverters INV.

The aforementioned supply voltage VddRAM corresponds to the primary supply voltage VregP in the primary supply mode MAlmP, and to the secondary supply voltage VregS in the secondary supply mode MAlmS.

Although advantageously being produced in technologies dedicated to the limitation of current leaks, the transistors incorporated in the inverters INV and the access transistors controlled by the signal Wd leak slightly.

Now, since the volatile memory circuit RAM includes many memory cells Cel, for example 4096, the sum of the slight current leaks becomes non-negligible on the scale of the entire memory circuit RAM.

Therefore, during a transition from the primary supply mode MAlmP to the secondary supply mode MAlmS, when the memory circuit RAM, drawing a leakage current IP, is switched to the secondary supply node NS, the level of the secondary supply voltage VregS could drop because of the leakage current, which is abruptly directed to the secondary supply NS.

However, the regulator RegS was pre-charged to the supply voltage VregS present on the secondary supply node NS during a pre-charging phase in the primary supply mode MAlmP by the pre-charging circuit CPrch.

It will be recalled that, in the pre-charging phase, a replica current IRAMR is made to pass through the replica circuit RAM-R, which is connected to the secondary supply node NS and which has the same configuration as at least one portion of the memory circuit RAM, then a pre-charging current Iprch that is representative of a current IS passed by the memory circuit RAM in the secondary supply mode MAlmS is generated from the replica current IRAMR, and the pre-charging current Iprch is made to pass to the secondary supply node NS.

In other words, during the pre-charging phase, a pre-charging current Iprch that is representative of a current IS passed by the memory circuit RAM was drawn to the secondary supply node NS. Thus, the secondary regulator RegS that generates the secondary supply voltage VregS was prepared with a view to the switching to the secondary supply node NS.

Specifically, the pre-charging circuit CPrch generates a pre-charging current Iprch that accurately reproduces the current IS passed by the memory circuit RAM in the secondary supply mode MAlmS. Thus, the transition from the primary supply mode MAlmP to the secondary supply mode MAlmS has very little or absolutely no effect on the secondary supply node NS.

In other words, the pre-charging circuit CPrch, which includes a replica circuit RAM-R having the same configuration as at least one portion of the memory circuit RAM, allows a secondary supply voltage VregS that is capable of withstanding the abrupt transition of supply mode without experiencing a drop in its level to be generated.

Since it experiences no drop on the transition, the value of the secondary supply voltage VregS may be decreased to the minimum value that acceptably prevents the loss of data, for example from 1.0 to 1.15 times the value of the minimum voltage for retention of data of the memory RAM.

Furthermore, for a given source AlmS of secondary supply voltage, the size of a memory RAM may be increased by virtue of the effect of the pre-charging circuit CPrch.

Figure 4:
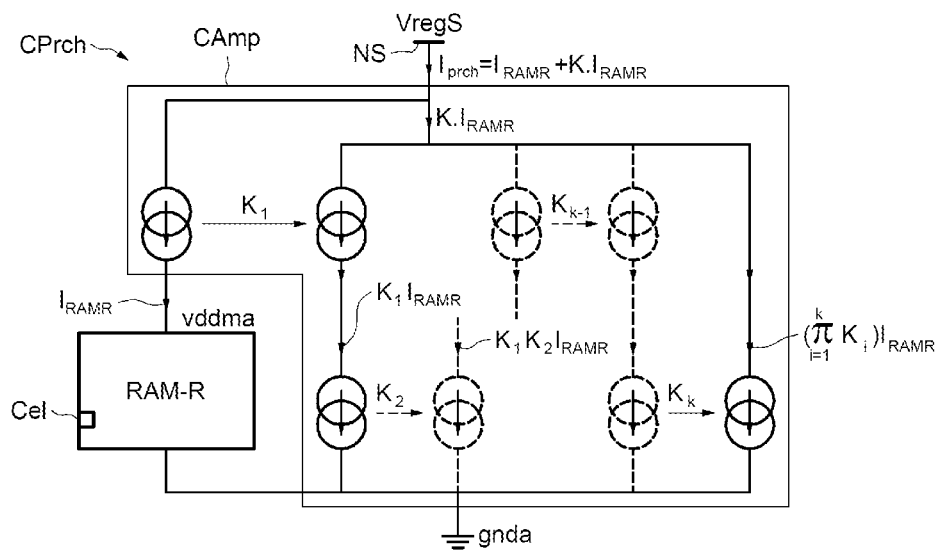

FIG. 4 shows an example embodiment of the pre-charging circuit CPrch.

The pre-charging circuit CPrch includes a replica circuit RAM-R and a current-amplifying circuit CAmp.

The replica circuit RAM-R has the same configuration as at least one portion of the volatile memory circuit (RAM), and in this example the replica circuit RAM-R corresponds to a fraction of the memory plane (MEM) of the volatile memory circuit (RAM).

The replica circuit RAM-R thus includes memory cells Cel that are twins of the memory cells of the memory plane (MEM), i.e. they are of identical design, are produced in the same fabrication steps, have the same spatial orientation, are in the same environment and have the same configuration.

The memory cells Cel of the replica circuit RAM-R and of the memory plane (MEM) thus have very small relative variations in terms of unexpected events that affect some or the whole of their manufacturing processes, and in terms of behavior with respect to temperature and of behavior with respect to the actual level of the supply voltage. This is reflected by equally small relative variations in the pre-charging current with respect to the current actually drawn by the memory circuit in the secondary supply mode.

The replica circuit RAM-R may furthermore include control and access elements that are twins of the control and access elements of the memory circuit (RAM).

Thus, the replica circuit RAM-R is configured to pass a replica current IRAMR that precisely reproduces a fraction of the current (IS) passed by the volatile memory circuit (RAM) in the secondary supply mode, in particular relative to variations in the current (IS) that are for example due to the conditions of use of the integrated circuit (CI).

The current-amplifying circuit CAmp is configured to amplify the replica current IRAMR passed by the replica circuit RAM-R into a current amplified by a gain K, namely KIRAMR.

In the pre-charging circuit CPrch, the pre-charging current Iprch includes the sum of the replica current IRAMR and of the amplified current KIRAMR.

In this example, the current-amplifying circuit CAmp includes a series of k elementary amplifiers Ki in parallel, with i [1;k], each amplifying a copied current by a respective gain Ki, the current copied by the first elementary amplifier K1 being the replica current IRAMR, and the current copied by the other elementary amplifiers Ki>1 being the current amplified by the preceding elementary amplifier Ki−1; i>1.

Thus, the gain K of the current-amplifying circuit CAmp may be written as $$K=\Sigma_{j=1}^{k}(\Pi_{i=1}^{j}K_i)\cdot I_{RAMR}.$$

The respective gains Ki may thus be dimensioned so that the gain K results in the generation of a pre-charging current $I_{prch}=I_{RAMR}+KI_{RAMR}$ that is very precisely representative of the current (IS) passed by the volatile memory circuit (RAM) supplied by the secondary supply voltage VregS.

In this example, the pre-charging circuit CPrch is thus configured to generate, during the pre-charging of the secondary supply node NS, a pre-charging current Iprch that is representative of a current IS passed by the memory circuit RAM in the secondary supply mode MAlmS.

Figure 5:
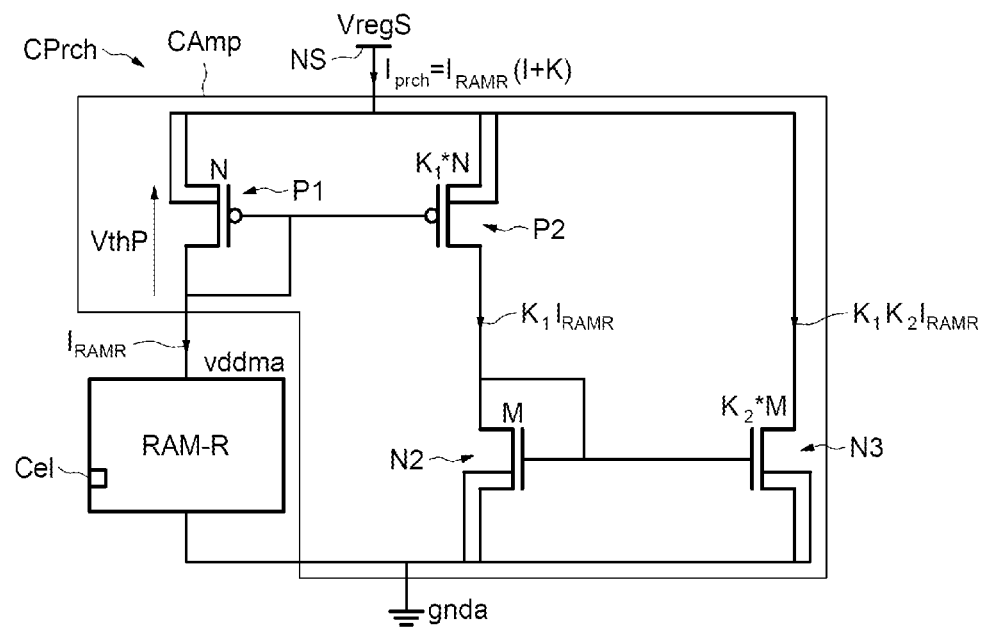

FIG. 5 shows an example of a pre-charging circuit CPrch of the same type as that described above with reference to FIG. 4.

In this example, the current-amplifying circuit CAmp includes two elementary amplifiers P1-P2, N2-N3 that respectively includes current mirrors.

Each current mirror includes a diode-connected input transistor P1, N2 and an output transistor P2, N3 that is controlled by the gate/source voltage of the respective input transistor.

The gain $K_1$ of the first elementary amplifier P1-P2 is obtained by connecting N elementary PMOS transistors in parallel to form the input transistor P1 and $K_1 \times N$ elementary PMOS transistors in parallel to form the output transistor P2. Likewise, the gain $K_2$ of the second elementary amplifier N2-M3 is obtained by connecting M elementary NMOS transistors in parallel to form the input transistor N2 and $K_2 \times M$ elementary NMOS transistors in parallel to form the output transistor N3.

The input transistor P1 is connected between the secondary supply node NS (via the fifth switch (SW5), which is shut in the primary supply mode, such as described above with reference to FIGS. 1 and 2) and the replica circuit RAM-R.

Thus, a threshold voltage VthP of the input transistor P1, present between the conduction terminals of the transistor P1 (because it is diode-connected) decreases by as much the secondary supply voltage VregS actually applied (vddma) to the replica circuit RAM-R.

Thus, the amplifying circuit CAmp is advantageously configured to amplify the replica current IRAMR with a gain K that takes into account the potential difference VthP between the conduction terminals of the input transistor P1.

Specifically, in this example, the respective gains $K_1$, $K_2$ of the elementary amplifiers P1-P2, N2-N3 are dimensioned to compensate, in the amplified current $KI_{RAMR}$, $K = K_1 + K_1 K_2$, for the difference between the current IRAMR passed by the replica circuit RAM-R at vddma=VregS−VthP and the current IRAMR passed by the replica circuit RAM-R at vddma=VregS.

Furthermore, the input transistor P1 is produced so as to minimize the value of its threshold voltage VthP. For example, VthP=200 mV.

Figure 6:
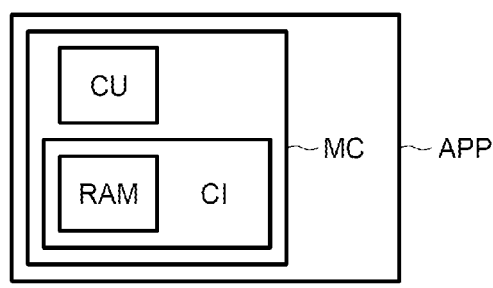

FIG. 6 shows an electronic apparatus APP, such as a mobile telephone, a personal computer or any other known apparatus, including an integrated circuit CI including a volatile memory circuit RAM that is able to operate in a primary supply mode or a secondary supply mode such as described above with reference to FIGS. 1 to 5, and furthermore incorporating a computing unit CU such as a processor or a controller.

The integrated circuit CI, the memory RAM and the computing unit CU are for example produced on the same semiconductor substrate, forming a microcontroller or microprocessor device MC with which the apparatus APP is equipped.

Moreover, the invention is not limited to these embodiments but encompasses each and every variant thereof. For example, the structures of the current-amplifying circuit that were described with reference to FIGS. 4 and 5 were given by way of example and other structures having analogous functions could be used without departing from the scope of the invention.

What is claimed is:

1. An integrated circuit, comprising:
a primary supply stage comprising a primary supply node, the primary supply stage being configured to deliver a primary supply voltage to the primary supply node;
a secondary supply stage comprising a secondary supply node, the secondary supply stage being configured to deliver a secondary supply voltage to the secondary supply node;
a pre-charging circuit;
a volatile memory circuit; and
a supply-switching circuit configured to:
connect a supply of the volatile memory circuit to the primary supply node in a primary supply mode;
connect the supply of the volatile memory circuit to the secondary supply node in a secondary supply mode; and
connect the secondary supply node to the pre-charging circuit in the primary supply mode;
wherein:
the secondary supply stage is configured to supply the secondary supply node with the secondary supply voltage during the primary supply mode; and
the pre-charging circuit is configured to, in the primary supply mode, generate a pre-charging current and pass the pre-charging current to the secondary supply node, the pre-charging current being representative of a current passed by the volatile memory circuit in the secondary supply mode.

2. The integrated circuit according to claim 1, wherein:
the pre-charging circuit comprises a replica circuit that is configured to generate a replica current that is at least a portion of the current passed by the volatile memory circuit in the secondary supply mode; and
the pre-charging circuit is configured to generate the pre-charging current from the replica current.

3. The integrated circuit of claim 2, wherein:
the replica current is a fraction of the current passed by the volatile memory circuit in the secondary supply mode, the fraction being less than one;
the pre-charging circuit further comprises a current-amplifying circuit configured to amplify the replica current to produce an amplified current; and
the pre-charging current comprises a sum of the replica current and the amplified current.

4. The integrated circuit of claim 3, wherein:
the current-amplifying circuit comprises at least one current mirror comprising an input transistor connected between the secondary supply node and the replica circuit; and
the at least one current mirror is configured to amplify the replica current with a gain indicative of a potential difference between conduction terminals of the input transistor.

5. The integrated circuit of claim 2, wherein:
the volatile memory circuit comprises a memory plane comprising memory cells; and
the replica circuit comprises further memory cells that are twins of the memory cells of the memory plane.

6. The integrated circuit of claim 2, wherein:
the volatile memory circuit comprises access and control elements; and
the replica circuit comprises further access and control elements that are twins of the access and control elements of the volatile memory circuit.

7. The integrated circuit of claim 1, wherein:
the volatile memory circuit is configured to retain data at a supply voltage higher than a minimum voltage for retention of data; and
the secondary supply stage is configured to deliver a secondary supply voltage having a value within a range that is between 1.0 and 1.15 times the minimum voltage for retention of data.

8. The integrated circuit of claim 1, wherein the primary supply stage comprises:
a primary voltage terminal configured to receive a primary voltage; and
a primary regulator configured to generate the primary supply voltage from the primary voltage.

9. The integrated circuit of claim 8, wherein the secondary supply stage comprises:
a secondary voltage terminal configured to receive a secondary voltage; and a secondary regulator configured to generate the secondary supply voltage from the secondary voltage.

10. The integrated circuit of claim 9, wherein the supply-switching circuit comprises:
a first controllable switch coupled between an input terminal of the secondary regulator and the primary voltage terminal;
a second controllable switch coupled between the input terminal of the secondary regulator and the secondary voltage terminal;
a third controllable switch coupled between the volatile memory circuit and the primary supply node;
a fourth controllable switch coupled between the volatile memory circuit and the secondary supply node; and
a fifth controllable switch coupled between the secondary supply node and the pre-charging circuit.

11. The integrated circuit of claim 10, wherein:
the second controllable switch and the fourth controllable switch are configured to be open during the primary supply mode; and
the first controllable switch, the third controllable switch, and the fifth controllable switch are configured to be closed during the primary supply mode.

12. The integrated circuit of claim 10, wherein:
the second controllable switch and the fourth controllable switch are configured to be closed during the secondary supply mode; and
the first controllable switch, the third controllable switch, and the fifth controllable switch are configured to be open during the secondary supply mode.

13. An electronic apparatus, comprising:
a processor or a controller; and
an integrated circuit comprising:
a primary supply stage comprising a primary supply node, the primary supply stage being configured to deliver a primary supply voltage to the primary supply node;
a secondary supply stage comprising a secondary supply node, the secondary supply stage being configured to deliver a secondary supply voltage to the secondary supply node;
a pre-charging circuit;
a volatile memory circuit; and
a supply-switching circuit configured to:
connect a supply of the volatile memory circuit to the primary supply node in a primary supply mode;
connect the supply of the volatile memory circuit to the secondary supply node in a secondary supply mode; and
connect the secondary supply node to the pre-charging circuit in the primary supply mode;
wherein:
the secondary supply stage is configured to supply the secondary supply node with the secondary supply voltage during the primary supply mode; and
the pre-charging circuit is configured to, in the primary supply mode, generate a pre-charging current and pass the pre-charging current to the secondary supply node, the pre-charging current being representative of a current passed by the volatile memory circuit in the secondary supply mode.

14. The electronic apparatus of claim 13, wherein the electronic apparatus comprises a mobile telephone or a personal computer.

15. The electronic apparatus of claim 13, wherein:
the pre-charging circuit comprises a replica circuit that is configured to generate a replica current that is at least a portion of the current passed by the volatile memory circuit in the secondary supply mode; and
the pre-charging circuit is configured to generate the pre-charging current from the replica current.

16. A method, comprising:
delivering a primary supply voltage of an integrated circuit to a volatile memory circuit during a primary supply mode, wherein the primary supply mode comprises:
generating, during a pre-charging phase, a pre-charging current, the pre-charging current being representative of a current passed by the volatile memory circuit in a secondary supply mode; and
passing the pre-charging current to a secondary supply node of the integrated circuit;
delivering a secondary supply voltage to the volatile memory circuit during the secondary supply mode; and
delivering the secondary supply voltage to the secondary supply node during the primary supply mode.

17. The method of claim 16, wherein the pre-charging current is generated, at least in part, based on a replica current that is at least a portion of the current passed by the volatile memory circuit in the secondary supply mode.

18. The method of claim 17, wherein generating the pre-charging current comprises amplifying the replica current into an amplified current, and summing the replica current and the amplified current to produce the pre-charging current.

19. The method of claim 18, wherein amplifying the replica current is dimensioned to compensate for a potential difference, introduced by the amplification, between a replica circuit that generates the replica current and the secondary supply node to which the secondary supply voltage is delivered.

20. The method of claim 16, wherein:
the volatile memory circuit is configured to retain data in memory at a supply voltage higher than a minimum voltage for retention of data; and
the secondary supply voltage has a value in a range that is between 1.0 and 1.15 times the minimum voltage for retention of data.

* * * * *